(12) United States Patent
Yoo

(10) Patent No.: US 8,558,377 B2
(45) Date of Patent: Oct. 15, 2013

(54) SEMICONDUCTOR PACKAGE MODULE

(75) Inventor: Jin O Yoo, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 13/286,771

(22) Filed: Nov. 1, 2011

(65) Prior Publication Data

US 2012/0104572 A1    May 3, 2012

(30) Foreign Application Priority Data

Nov. 1, 2010    (KR) .......................... 10-2010-0107766

(51) Int. Cl.
*H01L 23/552* (2006.01)
*H01L 23/02* (2006.01)
*H01L 23/34* (2006.01)

(52) U.S. Cl.
USPC ........... 257/724; 257/685; 257/686; 257/723; 257/659

(58) Field of Classification Search
USPC ........ 257/678–733, E21.499; 438/25, 26, 51, 438/55, 64, 106–127
See application file for complete search history.

(56) References Cited

U.S. PATENT DOCUMENTS

| | | | | |
|---|---|---|---|---|
| 5,945,741 A | * | 8/1999 | Ohsawa et al. | 257/777 |
| 6,531,338 B2 | * | 3/2003 | Akram et al. | 438/108 |
| 7,193,306 B2 | * | 3/2007 | Akram et al. | 257/686 |
| 2008/0063232 A1 | * | 3/2008 | Song | 381/355 |

FOREIGN PATENT DOCUMENTS

| | | |
|---|---|---|
| JP | 2005-328009 | 11/2005 |
| JP | 2010-080679 | 4/2010 |

OTHER PUBLICATIONS

Korean Office Action, w/ English translation thereof, issued in Korean Patent Application No. 10-2010-0107766, dated Sep. 27, 2011.

* cited by examiner

*Primary Examiner* — Chuong A Luu
*Assistant Examiner* — Cory Eskridge
(74) *Attorney, Agent, or Firm* — McDermott Will & Emery LLP

(57) ABSTRACT

There is provided a semiconductor package module capable of minimizing a thickness of the module in spite of including an electronic element having a large size. The semiconductor package module includes: a semiconductor package having a shield formed on an outer surface and a side thereof and at least one receiving part provided in a lower surface thereof, the receiving part having a groove shape; and a main substrate having at least one large element and the semiconductor package mounted on one surface thereof, wherein the large element is received in the receiving part of the semiconductor package and is mounted on the main substrate.

7 Claims, 5 Drawing Sheets

SEMICONDUCTOR PACKAGE MODULE

CROSS-REFERENCE TO RELATED APPLICATIONS

This application claims the priority of Korean Patent Application No. 10-2010-0107766 filed on Nov. 1, 2010, in the Korean Intellectual Property Office, the disclosure of which is incorporated herein by reference.

BACKGROUND OF THE INVENTION

1. Field of the Invention

The present invention relates to a semiconductor package module, and more particularly, to a semiconductor package module including a shielding member capable of shielding electromagnetic waves, while simultaneously protecting a passive element, a semiconductor chip, or the like, included in a package from an external environment.

2. Description of the Related Art

In accordance with a recent rapid increase in the demand for portable electronic apparatuses, the demand for the miniaturization and lightness of electronic elements mounted in these products has been continuously increased.

In order to realize the miniaturization and light weight of electronic elements, a system on chip (SOC) technology, integrating a plurality of individual elements in a single chip, a system in package (SIP) technology integrating a plurality of individual elements in one package, or the like, as well as various technologies reducing the individual sizes of mounted components have been required.

Particularly, it has been demanded that a high frequency semiconductor package using a high frequency signal such as a portable TV (DMB or DVB) module or a network module include various electromagnetic shielding structures in order to implement excellent electromagnetic interference (EMI) or electromagnetic susceptibility characteristic as well as miniaturization.

The general high frequency semiconductor package according to the related art mounts individual electronic elements on a substrate and then forms a molding part thereon by applying a resin in order to protect these electronic elements. In addition, a structure forming a shield on an outer surface of the molding part is well known in the art as a high frequency shielding structure. The shield applied to a general high frequency semiconductor package not only covers all of the individual electronic elements to protect the electronic elements therein from external impacts, but also is electrically connected to a ground to promote electromagnetic wave shielding.

The high frequency semiconductor package according to the related art has a size determined according to sizes of the electronic elements mounted therein. That is, according to the related art, since the shield is formed to include the electronic elements therein, when it includes a bulky element, the high frequency semiconductor package needs to be formed to have a correspondingly large size.

This defect acts as an obstacle to the miniaturizing and thinning of the high frequency semiconductor package.

SUMMARY OF THE INVENTION

An aspect of the present invention provides a semiconductor package module capable of minimizing a thickness of the module although it includes an electronic element having a large size.

According to an aspect of the present invention, there is provided a semiconductor package module, including: a semiconductor package having at least one receiving part provided in a lower surface thereof, the receiving part having a groove shape; and a main substrate having at least large element and the semiconductor package mount on one surface thereof, wherein the large element is received in the receiving part of the semiconductor package and is mounted on the main substrate.

The semiconductor package may include: a substrate; at least one electronic element mounted on one surface of the substrate; and a shield having the electronic element received therein and coupled to the substrate.

The substrate of the semiconductor package may have the at least one receiving part formed in an inner portion thereof.

The semiconductor package may further include an insulating molding part sealing a space between the substrate and the shield.

The molding part may include at least one receiving groove extending the receiving part.

The receiving groove may be formed to have an inlet having the same shape as that of the receiving part.

The large element may be formed to have a thickness thicker than that of the shield.

The large element may be formed to have a height smaller than a vertical distance from an upper surface of the main substrate to an upper surface of the semiconductor package.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
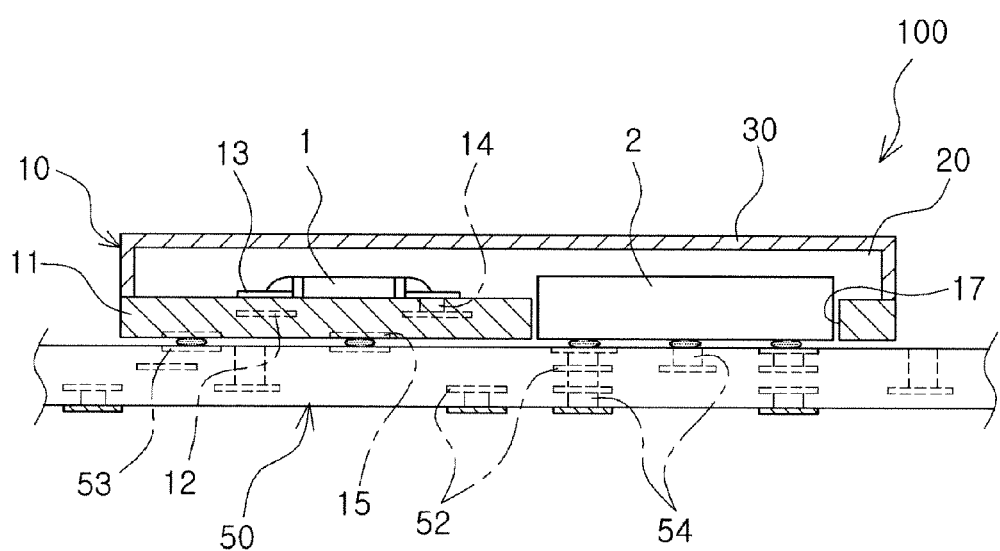
FIG. 1 is a cross-sectional view schematically showing a semiconductor package module according to an exemplary embodiment of the present invention.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention. Therefore, the configurations described in the embodiments and drawings of the present invention are merely most preferable embodiments but do not represent all of the technical spirit of the present invention. Thus, the present invention should be construed as including all the changes, equivalents, and substitutions included in the spirit and scope of the present invention at the time of filing this application.

Hereinafter, exemplary embodiments of the present invention will be described in detail with reference to the accompanying drawings. At this time, it is noted that like reference numerals denote like elements in appreciating the drawings. Moreover, detailed descriptions related to well-known functions or configurations will be ruled out in order not to unnecessarily obscure the subject matter of the present invention. Based on the same reason, it is to be noted that some components shown in the drawings are exaggerated, omitted or schematically illustrated, and the size of each component does not exactly reflect its real size.

Hereinafter, exemplary embodiments of the present invention will be described in detail with reference to the accompanying drawings.

FIG. 1 is a cross-sectional view showing a semiconductor package module according to an exemplary embodiment of the present invention. In addition, FIG. 2 is a cut-away perspective view showing an inner portion of the semiconductor package module shown in FIG. 1, and FIG. 3 is an exploded perspective view of the semiconductor package module shown in FIG. 2.

Figure 2:
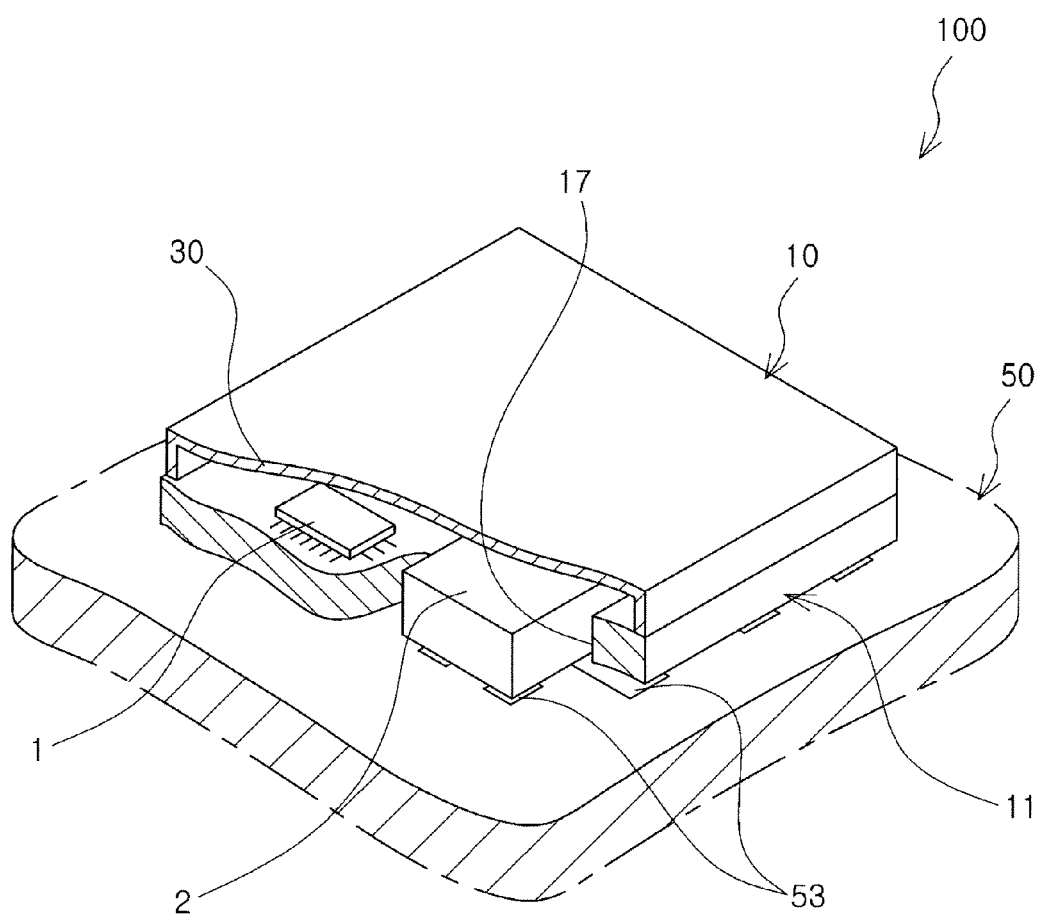
FIG. 2 is a cut-away perspective view showing an inner portion of the semiconductor package module shown in FIG. 1.
Figure 3:
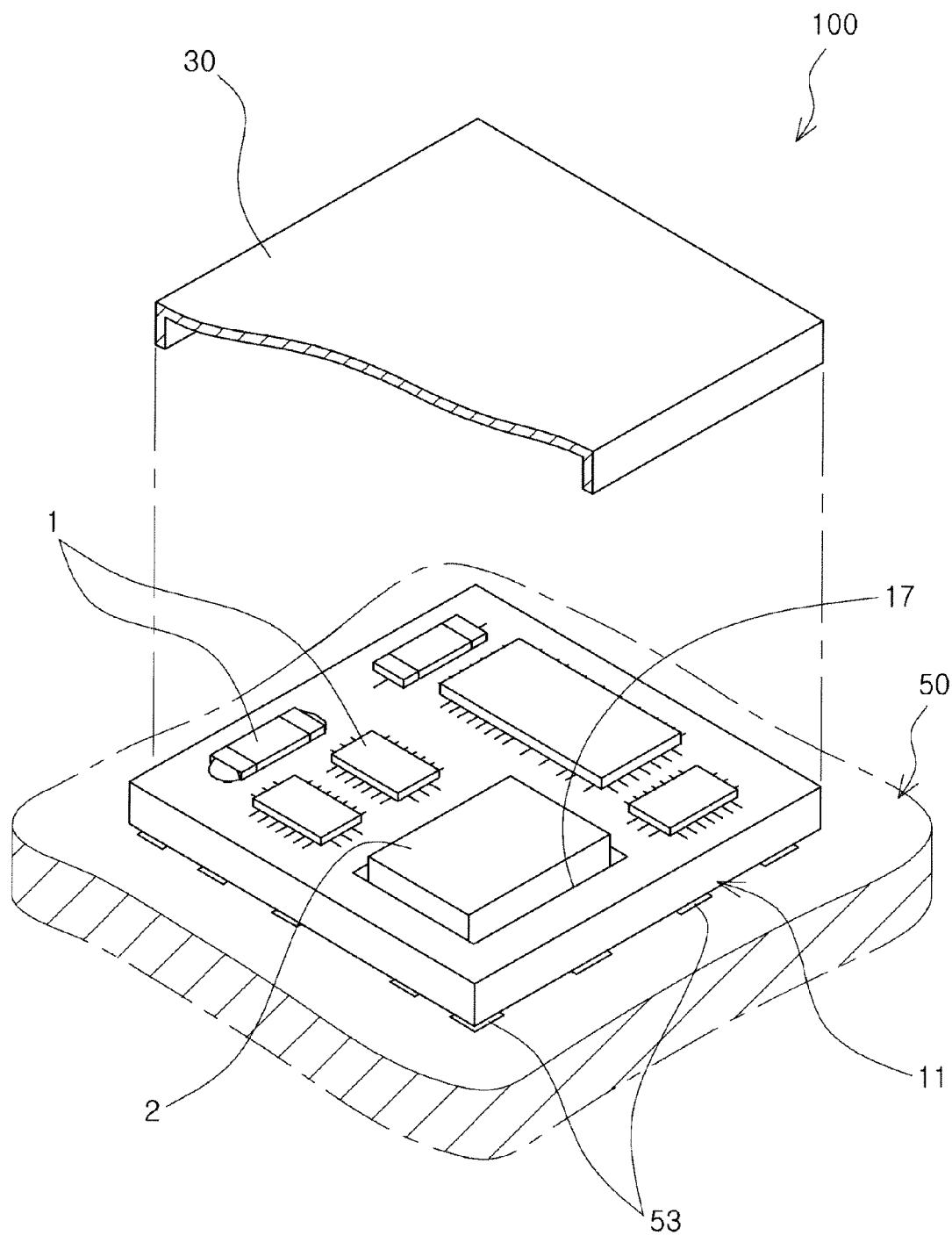
FIG. 3 is an exploded perspective view of the semiconductor package module shown in FIG. 2.

As shown in FIGS. 1 to 3, a semiconductor package module 100 according to an exemplary embodiment of the present invention is configured to include a semiconductor package 10 and a main substrate 50 having the semiconductor package 10 mounted thereon.

The semiconductor package 10 is configured to include a substrate 11, electronic elements 1, and a shield 30. Particularly, the semiconductor package 10 according to an exemplary embodiment of the present invention includes a groove shaped receiving part 17 in a lower surface thereof.

The substrate 11 has at least one electronic element 1 mounted on an upper surface thereof. As the substrate 11, various kinds of substrates (for example, a ceramic substrate, a printed circuit board (PCB), a flexible substrate, and the like) well known in the art may be used.

The upper surface of the substrate 11 maybe formed with mounting electrodes 13 for mounting the electronic elements 1 or wiring patterns (not shown) electrically interconnecting the mounting electrodes 13. In addition, the mounting electrode 13 may include at least one ground electrode (not shown) electrically connected to ground terminals (not shown) of the electronic elements 1.

Further, the substrate 11 according to an exemplary embodiment of the present invention may be a multi-layer substrate formed as a plurality of layers, and circuit patterns 12 for forming electrical connections may be formed between each of the plurality of layers. These circuit patterns 12 may include ground patterns (not shown) electrically connected to the ground electrode.

In addition, the substrate 11 according to an exemplary embodiment of the present invention may include external connection terminals 15 electrically connected to the mounting electrodes 13 formed on the upper surface thereof, the circuit patterns 12 formed in an inner portion thereof, and the like, and conductive via-holes 14 electrically interconnecting external connection terminals 15.

Furthermore, the substrate 11 according to an exemplary embodiment of the present invention may also be formed with a cavity capable of mounting the electronic element in the inner portion thereof.

In addition, the substrate 11 according to an exemplary embodiment of the present invention includes the receiving part 17 in the inner portion thereof.

The receiving part 17 may be formed in a hole or a groove shape penetrating through the substrate 11, and is formed to have a size capable of receiving electronic elements having a large size (hereinafter, referred to as large elements) 2 of the electronic elements described below in an inner portion thereof.

The receiving part 17 is formed corresponding to a position at which the large element 2 is mounted in the inner portion of the substrate 11. Accordingly, the receiving part 17 may be formed in the center of the substrate 11 or along the side of the substrate 11 according to the circuit pattern of the substrate or the arrangement of the electronic elements 1.

The electronic elements 1 include various elements such as a passive element and an active element, and all of the elements capable of being mounted on the substrate 11 or capable of being embedded in the inner portion of the substrate 11 may be used as the electronic elements 1.

In addition, the electronic elements 1 according to an exemplary embodiment of the present invention may include large elements 2 having a large size.

The large elements 2 according to an exemplary embodiment of the present invention may be preferably mounted on the substrate 11 of the semiconductor package 10; however, in this case, it increase size or volume of the semiconductor package 10 due to the size thereof.

For example, the large elements 2 according to an exemplary embodiment of the present invention may be elements having a higher height than those of other electronic elements 1, and particularly, may be elements formed to be higher than a vertical thickness of the substrate 11 or the shield 30 of the semiconductor package 10.

As examples of the large elements, an RF filter, a high capacitance capacitor, a high inductance inductor, and the like, may be used, without being limited thereto.

According to an exemplary embodiment of the present invention, these large elements 2 are mounted on the main substrate 50 described below rather than the substrate 11. A detailed description thereof will be provided in a description of the main substrate 10.

The shield 30 has the electronic elements 1 received therein and is coupled to the substrate 11 to shield unnecessary electromagnetic waves introduced from the outside. In addition, the shield 30 shields electromagnetic waves generated in the electronic elements 1 and the large element 2 from being radiated to the outside.

The shield 30 is inevitably grounded in order to shield the electromagnetic waves. Therefore, in the semiconductor package 10 according to an exemplary embodiment of the present invention, the shield 30 may be grounded by being electrically connected directly to the ground pattern or the ground electrode formed on the substrate 11 of the semiconductor package 10.

The shield 30 according to an exemplary embodiment of the present invention may be formed to have a form of a metal case made of a conductive material.

The main substrate 50 has at least one semiconductor package 10 mounted on one surface thereof and electrically connected thereto. In addition, the main substrate 50 is mounted with various electronic components in addition to the semiconductor package 10.

The main substrate 50 according to an exemplary embodiment of the present invention may be a general printed circuit board (PCB) provided in electronic products and may be a module substrate having a plurality of semiconductor packages 10 mounted thereon.

Similar to the substrate 11 provided in the semiconductor package 10, various kinds of substrates (for example, the ceramic substrate, the printed circuit board, the flexible substrate, and the like) well known in the art may be used as the main substrate 50.

In addition, the upper surface of the main substrate 50 may be formed with mounting electrodes 53 for mounting the electronic elements 1 or wiring patterns (not shown) electrically interconnecting the mounting electrodes 53.

The main substrate 50 according to an exemplary embodiment of the present invention may be a multi-layer substrate formed as a plurality of layers, and circuit patterns 52 for forming electrical connections may be formed between each of the plurality of layers.

Further, the main substrate 50 according to an exemplary embodiment of the present invention may include the mounting electrodes 53 formed on the upper surface thereof, the circuit patterns 52 formed in an inner portion thereof, and conductive via-holes 54 electrically connecting the mounting electrodes 53 and the circuit patterns 52. In addition, the main substrate 50 according to an exemplary embodiment of the present invention may also be formed with a cavity (not shown) capable of embedding the electronic components in an inner portion of the main substrate 50.

Meanwhile, as described above, the main substrate 50 according to an exemplary embodiment of the present invention is mounted with has at least one large element 2.

The large element 2 is mounted in an area of the main substrate 50 on which the semiconductor package 10 is mounted. More specifically, when the semiconductor package 10 is mounted on the main substrate 50, the large element 2 is mounted at a position capable of being inserted into the receiving part 17 formed in the substrate 11 of the semiconductor package 10.

At this time, the large element 2 may be electrically connected to the electronic elements 1 of the semiconductor package 10 through the mounting electrodes 53 of the main substrate 50, external connection terminals 18 of the semiconductor package 10, and the like.

Since the large element 2 according to an exemplary embodiment of the present invention should be received in the receiving part 17 of the semiconductor package 10 while simultaneously being mounted on the main substrate 50, it is formed in a height smaller than a vertical distance from an upper surface of the main substrate 50 to an upper surface of the semiconductor package 11.

In addition, when the height of the large element 2 is smaller than a thickness of the shield 30 of the semiconductor package 10, although the large element is mounted on the substrate 11 of the semiconductor package 10 rather than the main substrate 50, a thickness of the semiconductor package 10 is not increased.

Accordingly, the semiconductor package module 100 according to an exemplary embodiment of the present invention may obtain an optimal effect in the case in which the height of the large element 2 is formed to be thicker than the thickness (that is, the vertical distance) of the shield 30 of the semiconductor package 10.

The semiconductor package module 100 according to an exemplary embodiment of the present invention is not limited to the above-mentioned exemplary embodiment but may be variously applied.

Figure 4:
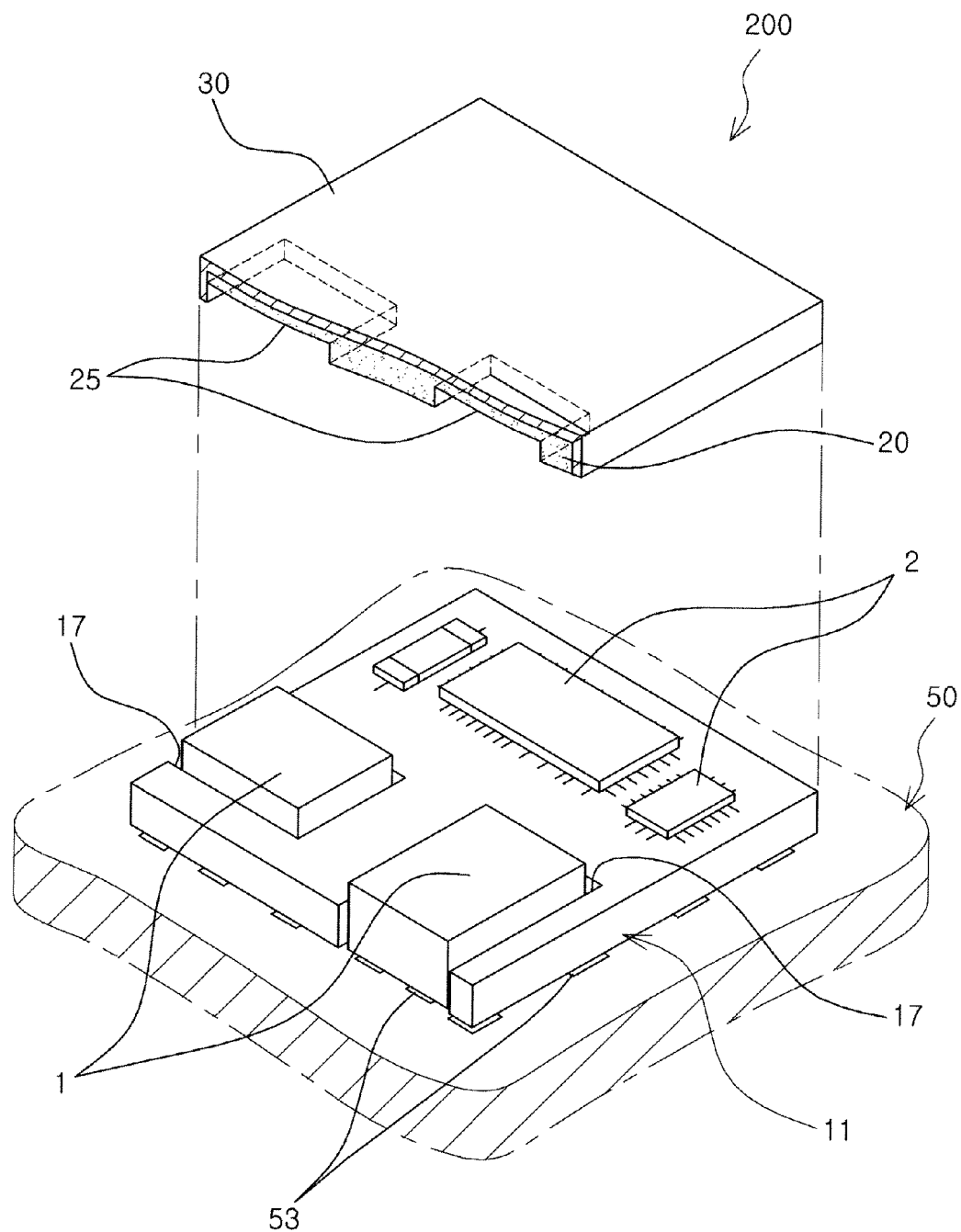
FIG. 4 is an exploded perspective view schematically showing a semiconductor package module according to another exemplary embodiment of the present invention.

FIG. 4 is an exploded perspective view schematically showing a semiconductor package module according to another exemplary embodiment of the present invention.

Referring to FIG. 4, a semiconductor package of a semiconductor package module 200 according to another embodiment of the present invention has the large element 2 disposed adjacently to a side of the substrate 11.

When the large element 2 is disposed at the side of the substrate as described above, the receiving part 17 of the substrate 17 may be formed to have a groove shape including the side of the substrate 11 rather than a hole shape.

The semiconductor package of the semiconductor package module 200 according to another exemplary embodiment of the present invention includes a molding part 20.

The molding part 20 is filled between the substrate 11 and the shield 30 to seal the electronic elements 1 mounted on the substrate 11. The molding part 20 is filled between the electronic elements 1 mounted on the substrate 11, thereby preventing electrical short-circuit from being generated between the electronic elements 1. In addition, the molding part 20 encloses the outside of the electronic elements 1 and fixes the electronic elements 1 to the substrate to securely protect the electronic elements from external shocks.

Further, the molding part 20 according to another exemplary embodiment of the present invention includes a receiving groove 25 extending the receiving part 17 of the substrate 11 therein.

The receiving groove 25 is formed upward from a lower surface of the molding part 20, and is formed corresponding to the receiving part 17 of the substrate 11 as described above.

That is, the receiving groove 25 is formed to have an inlet in the same shape (that is, the same area) as that of the receiving part 17, and is formed to have a groove in a depth capable of receiving the large element 2 therein.

According another exemplary embodiment of the present invention, a case in which one receiving groove 25 is provided to the mould part 20 has been described by way of example. However, the present invention is not limited thereto but the receiving groove 25 having various numbers and various shapes may be formed according to the number and the size of the large elements 2.

Meanwhile, when the receiving groove 25 according to another exemplary embodiment of the present invention is formed in a form of the metal case, it may be formed to have a through-hole shape rather than the groove shape.

The molding part 20 may be made of an insulating material including a resin material such as an epoxy, or the like. In addition, the molding part 20 according to an exemplary embodiment of the present invention may be formed by disposing the substrate 11 in a mold in which a protrusion having a shape corresponding to the receiving part 17 and the receiving groove 25 is formed and injecting a forming resin into an inner portion of the mold. However, the present invention is not limited thereto.

When the semiconductor package includes the mould part 20 as described above, the shield 30 according to another exemplary embodiment of the present invention not only has the form of the metal case, but may also be made of various materials having conductivity. For example, the shield 30 according to another exemplary embodiment of the present invention may be manufactured by applying the resin material including conductive powders to an outer surface of the molding part 20 or forming a metal thin film. When the metal thin film is formed, various methods such as a sputtering method, a vapor deposition method, an electroplating method, an electroless plating method may be used.

In addition, the shield 30 may be a metal thin film formed by applying a spray coating method to the outer surface of the molding part 20. The spray coating method has advantages in that it may form a uniform application film and is inexpensive as compared to other processes. In addition, the shield 30 may be the metal thin film formed through a screen printed method.

Figure 5:
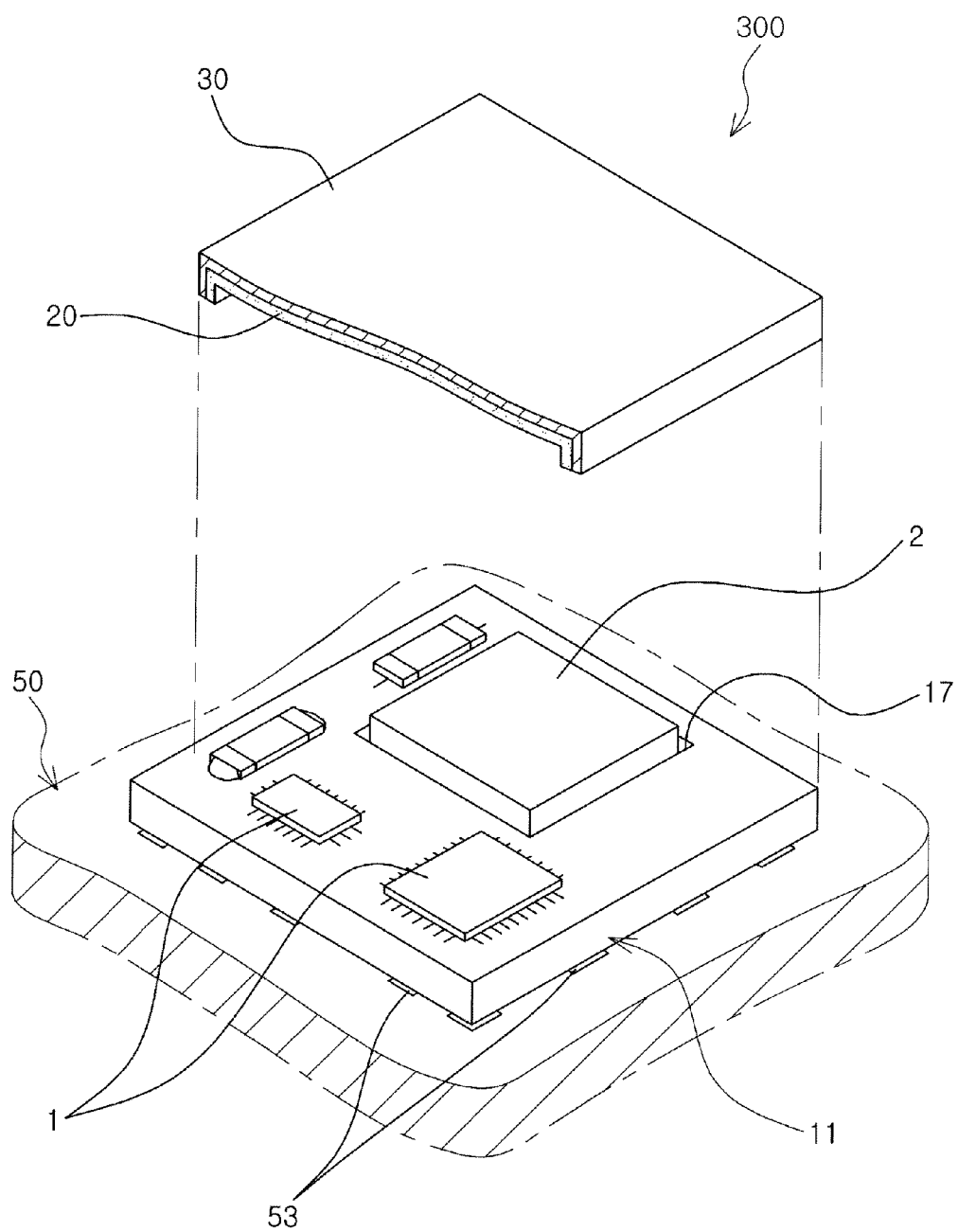
FIG. 5 is an exploded perspective view schematically showing a semiconductor package module according to another exemplary embodiment of the present invention.

FIG. 5 is an exploded perspective view schematically showing a semiconductor package module according to another exemplary embodiment of the present invention.

Referring to FIG. 5, in a semiconductor package of a semiconductor package module 300 according to another exemplary embodiment of the present invention, an IC chip, which is an active element" is used as the large element 2. The semiconductor package module 300 according to another exemplary embodiment of the present invention may use any elements as the large element 2 if they are elements capable of the thickness of the semiconductor package 10 regardless of a shape or a kind thereof.

In addition, the semiconductor package of the semiconductor package module 300 according to another exemplary embodiment of the present invention includes the molding part 20, similar to the exemplary embodiment of the present invention described above with reference to FIG. 4. The molding part 20 according to another exemplary embodiment of the present invention is formed to have a cap shape such as the shield 30. Accordingly, both of the electronic elements 1 and the large element 2 are received in a space formed in the molding part 20.

When the molding part 20 is formed to have the cap shape as described above, the shield 30 according to another exemplary embodiment of the present invention not only has the form of the metal case, but may also be made of various materials having conductivity, similar to the exemplary embodiment of the present invention described above with reference to FIG. 4.

A manufacturing method of the semiconductor package module 100 (FIG. 1) according to an exemplary embodiment of the present invention configured as described above will be schematically described.

First, the large element 2 is seated on the main substrate 50. Then, the semiconductor package 10 is seated on the main substrate 50 so that the large element 2 is inserted into the receiving part 17. Herein, conductive pastes may be interposed between the large element 2, the semiconductor package 10, and the mounting electrode 53 of the main substrate 50.

Thereafter, the main substrate having the large element 2 and the semiconductor package 10 seated thereon passes through a reflow oven, such that the conductive pastes are cured to a solder. According to the conductive pastes are cured to the solder, the large element 2 and the semiconductor package 10 seated on the main substrate 50 are firmly bonded to the main substrate 50 and are also electrically connected thereto. The semiconductor package module 100 according to an exemplary embodiment of the present invention may be completed through the process as described above. However, the present invention is not limited thereto but various methods may be used if they may firmly mount the large element 2 and the semiconductor package 10 on the main substrate 50.

As set forth above, the semiconductor package module according to the exemplary embodiments of the present invention may not only protect the electronic elements mounted on the substrate from external force by the molding part, but may also further improve an electromagnetic wave shielding effect by the shield formed on the outer surface of the molding part.

In addition, in the semiconductor package module according to the exemplary embodiments of the present invention, at least one large element is mounted on the main substrate rather than the substrate of the semiconductor package and the semiconductor package is mounted on the main substrate so that the large element is received in the inner portion of the semiconductor package.

Accordingly, the thickness of the semiconductor package may be minimized, and the entire thickness of the semiconductor package module may be minimized.

In addition, according to the exemplary embodiments of the present invention, the large element mounted on the main substrate is received in the inner portion of the semiconductor package. Therefore, although the large element is not mounted on the substrate of the semiconductor package, the electromagnetic wave may be shielded by the shield formed on the semiconductor package.

Accordingly, the semiconductor package module according to the exemplary embodiments of the present invention may shield the large element from the electromagnetic wave, while maintaining a thin thickness thereof although the large element is included therein.

The semiconductor package module according to the exemplary embodiments of the present invention is not limited to the above-mentioned exemplary embodiments but may be variously applied.

In addition, although the above-mentioned exemplary embodiments have described the case in which the semiconductor package having the shield is mounted on the main substrate, the present invention is not limited thereto but may be variously applied to any apparatuses if they are apparatuses including the shield for shielding the electromagnetic wave.

While the present invention has been shown and described in connection with the exemplary embodiments, it will be apparent to those skilled in the art that modifications and variations can be made without departing from the spirit and scope of the invention as defined by the appended claims.

What is claimed is:

1. A semiconductor package module, comprising:
a semiconductor package having at least one receiving part provided in a lower surface thereof, the receiving part having a groove shape; and
a main substrate having at least one large element and the semiconductor package mounted on one surface thereof,
wherein the large element is received in the receiving part of the semiconductor package and is mounted on the main substrate,
wherein the semiconductor package includes a substrate, at least one electronic element mounted on one surface of the substrate, and a shield having the at least one electronic element received therein and coupled to the substrate, and
wherein a thickness of the large element is greater than a thickness of the substrate of the semiconductor package.

2. The semiconductor package module of claim 1, wherein the substrate of the semiconductor package has the at least one receiving part formed in an inner portion thereof.

3. The semiconductor package module of claim 2, wherein the semiconductor package further includes an insulating molding part sealing a space between the substrate and the shield.

4. The semiconductor package module of claim 3, wherein the molding part includes at least one receiving groove extending the receiving part.

5. The semiconductor package module of claim 4, wherein the at least one receiving groove is formed to have an inlet having a shape corresponding to a shape of a cross section of the receiving part.

6. The semiconductor package module of claim 1, wherein the large element is formed to have a thickness thicker than that of the shield.

7. The semiconductor package module of claim 1, wherein the large element is formed to have a height smaller than a vertical distance from an upper surface of the main substrate to an upper surface of the semiconductor package.

* * * * *